United States Patent [19]

Han et al.

[11] Patent Number: 5,343,082
[45] Date of Patent: Aug. 30, 1994

[54] ADDRESS TRANSITION DETECTION CIRCUIT

[75] Inventors: Gwang-Ma Han; Gyu-Suk Kim, both of Kyoungki, Rep. of Korea

[73] Assignee: Hyundai Electronics Industries Co., Ltd., Kyoungki, Rep. of Korea

[21] Appl. No.: 998,020

[22] Filed: Dec. 29, 1992

[30] Foreign Application Priority Data

Dec. 31, 1991 [KR] Rep. of Korea ............... 91-25754

[51] Int. Cl.$^5$ ............................................ H03K 5/153
[52] U.S. Cl. ................................... 307/234; 307/518; 307/595
[58] Field of Search ............. 307/234, 265, 595, 602, 307/605, 606, 511, 514, 260, 607, 603, 518

[56] References Cited

U.S. PATENT DOCUMENTS

| | | | |
|---|---|---|---|
| 3,728,553 | 4/1973 | Wakamatsu et al. | 307/234 |
| 3,828,258 | 8/1974 | Hills et al. | 307/234 |
| 3,911,368 | 10/1975 | Tarczy-Hornoch | 307/602 |
| 4,592,028 | 5/1986 | Konishi | 365/230 |
| 4,717,835 | 1/1988 | Takeuchi | 307/265 |
| 4,994,687 | 2/1991 | Fujii et al. | 307/265 |

Primary Examiner—William L. Sikes
Assistant Examiner—My-Trang Nuton
Attorney, Agent, or Firm—Morgan & Finnegan

[57] ABSTRACT

In the conventional address transition detection circuit of a memory device, same signals are generated in a normal operation state, and in a noise induced operation state thereby unwanted ATD pulses are generated by the noises activating the internal circuit related to these, thus causing malfunctions. In order to solve such problems, the present invention, by inverting outputs of the first and second delay/inversion units and then inputting the inverted signals into the cross coupled logic combination unit, enables one to distinguish between two operations. This is achieved by gaining ATD pulse width during a normal operation and by receiving the noise pulse width unchanged. Accordingly, by evaluating the ATD pulse width, one can determine whether it is an ATD operation by a normal address transition or whether an unnecessary ATD operation by the noises. Also, the operation of the internal circuit related to these can be controlled, thus preventing the malfunctions caused by the noises.

6 Claims, 3 Drawing Sheets

ADDRESS TRANSITION DETECTION CIRCUIT

BACKGROUND OF THE INVENTION

The invention relates to an address transition detection(ATD) circuit of a memory device, and more particularly to an address transition circuit capable of preventing the malfunction caused by wrongly interpreting noises as normal ATD pulses. This is achieved by generating different ATD pulses for normal operation state and noise induced operation state.

Many types of address transition detection techniques exist, and they are widely used in semiconductor memory devices. Basically, however, an address transition detection is a technique that generates one pulse by detecting the changed address input every time an address input changes. ATD pulses made from each address are combined and are used for precharging, equalizing, and sense-enabling of the internal circuit of semiconductor devices. As shown in FIG. 1, a conventional address transition detection circuit is constructed with an input control unit 1 that includes an inverter I1 and a NOR gate NOR1 into which address signals A and chip select signals $\overline{CS}$ are input; a delay/inversion unit 2 that delays and inverses output signals B from the said input control unit 1 using sequentially arranged inverters I2, I3, I4; another delay/inversion unit 3 that delays, inverses, and outputs inverted output signals E of the said input control unit 1 using sequentially arranged inverters I6, I7, I8, after the signal B pass through an inverter I5; and a logic combination unit 4 having a NOR gate NOR2 that performs NORing after receiving output signals C of the said delay/inversion unit 2 and output signals B of the said input control unit 1, a NOR gate NOR3 that performs NORing after receiving output signals E of the said another delay/inversion unit 3 and inverted output signals F of the said input control unit 1, and a NOR gate NOR4 that performs NORing on output signals D and G of the said two NOR gates NOR2, and NOR3 and outputs them as ATD pulse signals $\phi AT$.

In the following section, the conventional technique is explained in detail by referring to the operation timing diagrams given in FIG. 2 and FIG. 3.

First, when in normal operation state as in FIG. 2, address signals A given in (a) of FIG. 2 are input and then delayed signals B given in (b) of FIG. 2 are output through a NOR gate NOR1 and an inverter I1. Then, at the delay/inversion unit 2, these signals B are output as delayed/inverted signals C given in (c) of FIG. 2, using serially connected odd-numbered inverters 12,13,14. Then, a NOR gate NOR2 performs NORing on the said signals B, C and generates signals D given in (d) of FIG. 2. On the other hand, the output signals B of the said input control unit 1 are output as inverted signals E given in (e) of FIG. 2 by an inverter I5. Then, this signal is output as delayed/inverted signals F by serially connected odd-numbered inverters I6-I8. Then, a NOR gate NOR3 performs NORing on the said signals E, F to generate output signals G given in (g) of FIG. 2. Output signals D and G of the NOR gates NOR2, and NOR3 are NORed again at a NOR gate NOR4 and then ATD pulses $\phi AT$ given in (h) of FIG. 2. are generated.

FIG. 3 illustrates a noise induced operation state where noise pulses are generated. The waveform illustrated on the left side of the drawing indicates the case where noise pulses in low state are generated and the waveform illustrated on the right side of the drawing indicates the case where noise pulses in high state are generated. Here, for the sake of convenience, the case where noises in low state are input will be explained. When noises of low pulses given in (a) of FIG. 3 enter as inputs, they go through an input control unit 1 and a delay/inversion unit 2. Then, noises of high pulses given in (d) of FIG. 3 appear at the NOR gate (NOR 2). On the other hand, output signals of the input control unit 1 pass through an inverter I5 and become inverted, and then they pass through the delay/inversion unit 3. Then, they are inut into a NOR gate NOR3. Accordingly, at the output of the NOR gate NOR3, noises of slightly delayed high pulses given in (g) of FIG. 3 appear. As a result, the final outputs of the address transition detection circuit that are output after NORing the outputs of NOR gates NOR2 and NOR3 appear as pulses having a certain width and overlapped noises of low pulses as shown in (h) of FIG. 3.

If we compare these with the ATD pulses generated during the normal operation state which are given in (h) of FIG. 2, we find that the noise pulses having almost the same width as normal ATD pulses are generated and that the internal circuit may therefore mis-interpret noise pulses as normal ATD pulses. In other words, the above prior art address transition detection circuit, when in a normal operation state or an induced operation state, generates the same signals. Accordingly, unwanted ATD pulses are generated by noises and the internal circuit related to these are activated, thus causing malfunctions such as reading the wrong data.

SUMMARY OF THE INVENTION

To solve the above-mentioned problems, the present invention has added two inverters onto the conventional address transition detection circuit; each of two inverters are cross-coupled onto NOR gates NOR12, NOR13. Thus, using the embodiments of the present invention, an address transition detection circuit that can prevent malfunctions due to noises is made.

DETAILED DESCRIPTION OF PREFERRED EMBODIMENTS OF THE INVENTION

A detailed description of the embodiments of the present invention will be given as follows by referring to the attached drawings.

Figure 4:
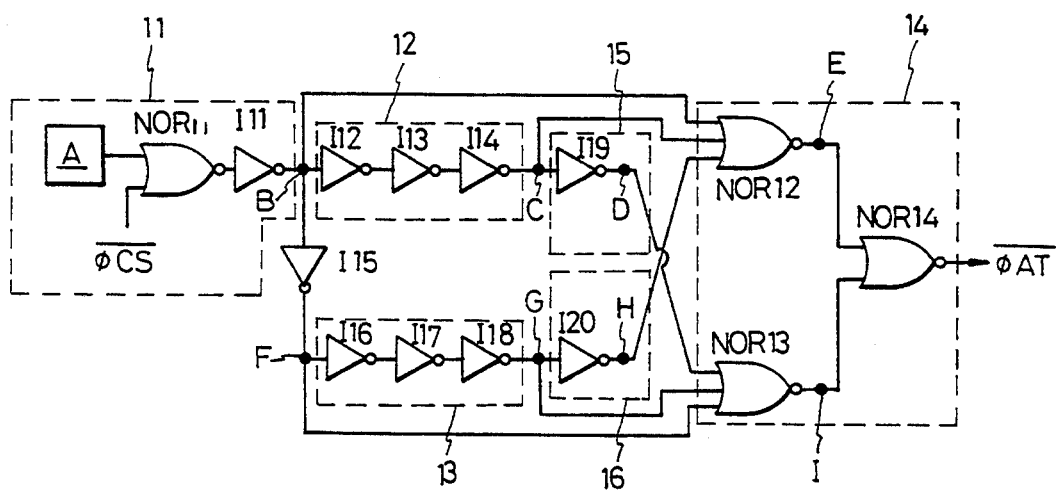
FIG. 4 is a diagram of the address transition detection circuit according to the present invention.

FIG. 4 is an illustration of the address transition detection circuit of the present invention. The address transition detection circuit is constructed with an input control unit 11 that receives input signals A first through a NOR gate NOR11 and an inverter I11 using chip select signals $\overline{CS}$; a first delay/inversion unit 12 that delays, inverts, and produces output signals B of the said input control unit 11; a second delay/inversion unit 13 that delays, inverses, and outputs the inverted signal F of the said output signals B of the said input control unit 11; and a logic combination unit 14 which logically combines output signals C and G of the said first and second delay/inversion units 12 and 13, and output signals B and its inverted signals F of the said input control unit 11, and which then generates ATD pulse signal $\overline{\phi AT}$. In addition to these, the address transition detection circuit includes first and second control units 15,16 that control paths so that while one side is generating pulses, the other side is disabled. At this time, output signals C, G of the said first and second delay/inversion units 12,13 are inverted using the inverters control inverters I19,I20 and then these inverted signals D, H are used as inputs of the said third NOR gates $NOR_{13}$, $NOR_{12}$, respectively. The connection of inverter $I_{19}$ to NOR gate $NOR_{13}$ and inverter $I_{20}$ to NOR gate $NOR_{12}$ defined a cross coupled arrangement.

In the following section, the embodiments of the present invention are explained by referring to the operation timing diagrams given in FIG. 5 and 6.

Figure 5:
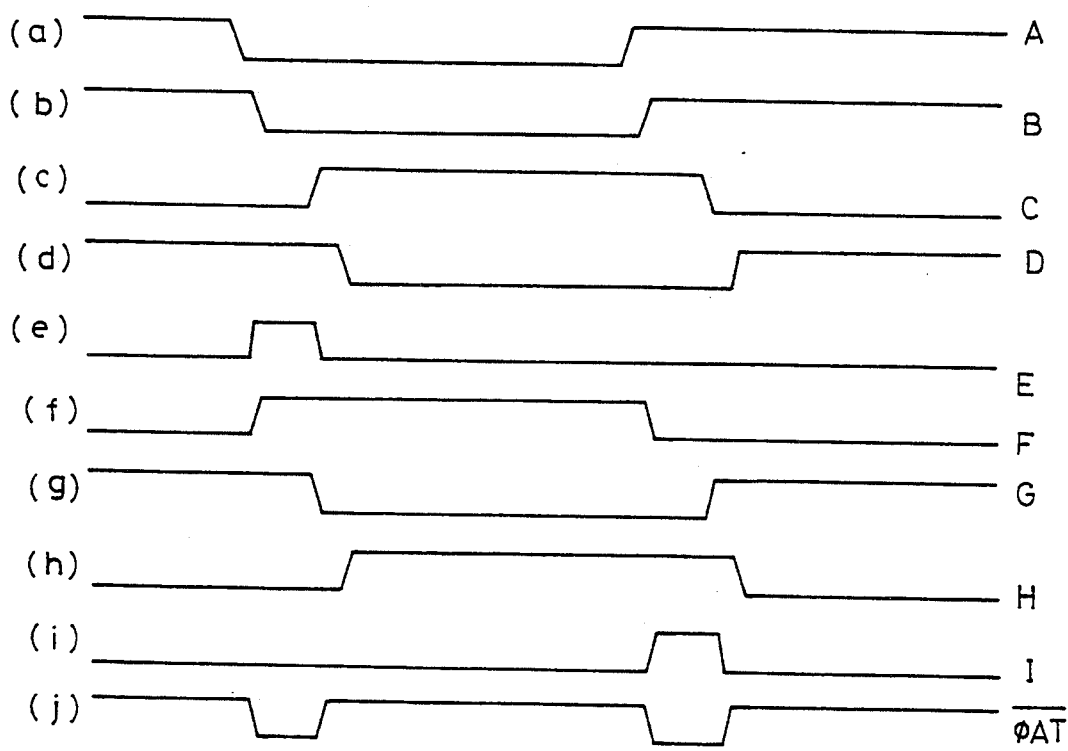
FIG. 5 is an illustration of the normal operation state waveforms of the circuit given in FIG. 4.

First, when in normal state, signals B given in (b) of FIG. 5 generated from address inputs A given in (a) of FIG. 5 by the input control unit 11 are passed through inverters I12–I14 and delayed for some time as in (c) of FIG. 5. Then, these delayed signals C are again inverted as in (d) of FIG. 5 using the control inverter I19 to make them into input of the third NOR gate NOR13. Then, signals F that have been inverted by the intermediate inverter I15 as in (f) of FIG. 5 are passed through the inverters I16–I18 as in (g) of FIG. 5 and delayed for some time. Then, these signals G are inverted by the control inverter I20 as in (h) of FIG. 5 to make them into inputs of the second NOR gate NOR12.

Then, the said second and third NOR gates NOR12, NOR13 generate respective output signals E, I that have been NORed as in (e)and (i) of FIG. 5 using each signal B,C,H; F,G,D as input and then ATD pulse signals as in (j) of FIG. 5 are generated by the fourth NOR gate NOR14.

That is, when the said signal B is transmitted from high level to low level, the said second NOR gate NOR12 produces output pulses and when the said signal is transmitted from low level to high level, the said third NOR gate NOR13 produces output pulses.

Figure 6:
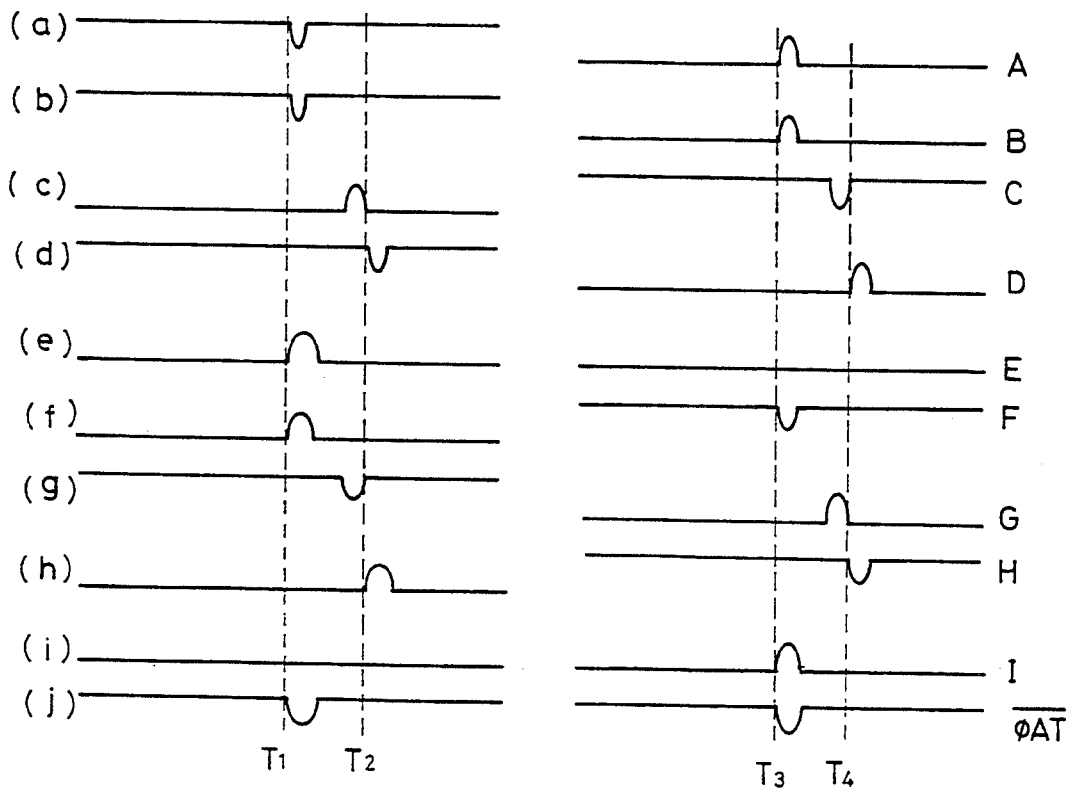
FIG. 6 is an illustration of the noise induced operation state waveforms of the circuit given in FIG. 4.

Accordingly, when in noise induced operation state as in FIG. 6, outputs D of the said control inverter I9 are used as inputs of third NOR gate NOR13 in order to send noise signals to ATD pulse signals. Reversely, outputs H of the said control inverter 20 are used as inputs of the said second NOR gate NOR12. Then, while a path that generates pulses among the said second and third NOR gates NOR12, NOR13 is being activated, the opposite path is disabled. At this time, the said first and second delay units 12,13 determine the width of ATD pulses. Also, odd-numbered inverter chains are used because the control inverters I19, I20 must remain in activation state until the opposite path is disabled.

Figure 1:
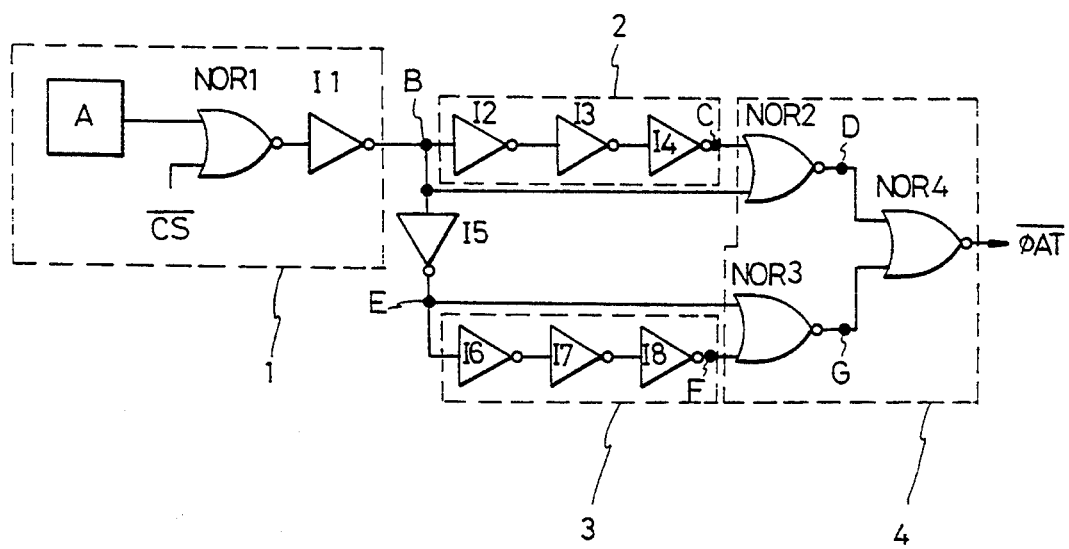
FIG. 1 is a diagram of the conventional address transition detection circuit.
Figure 2:
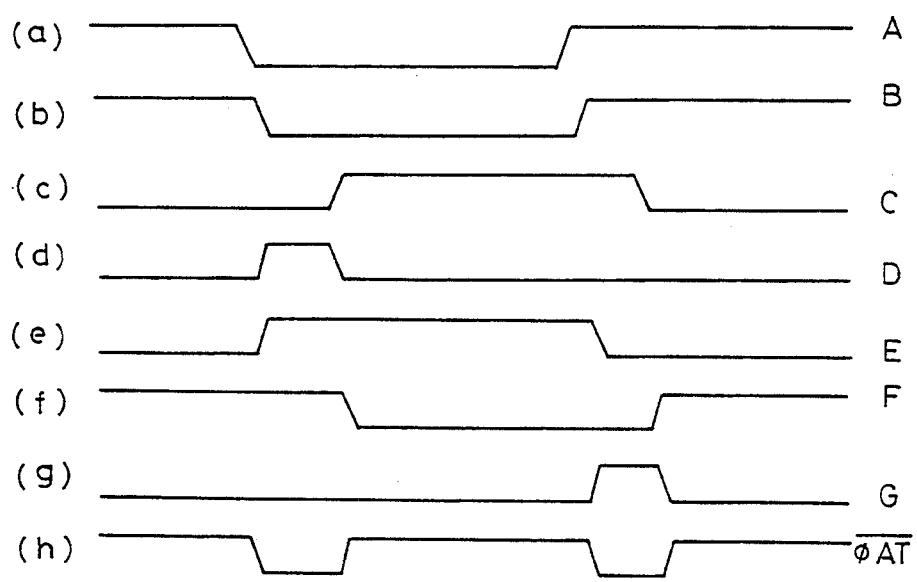
FIG. 2 is an illustration of the normal operation state waveforms of the circuit given in FIG. 1.
Figure 3:
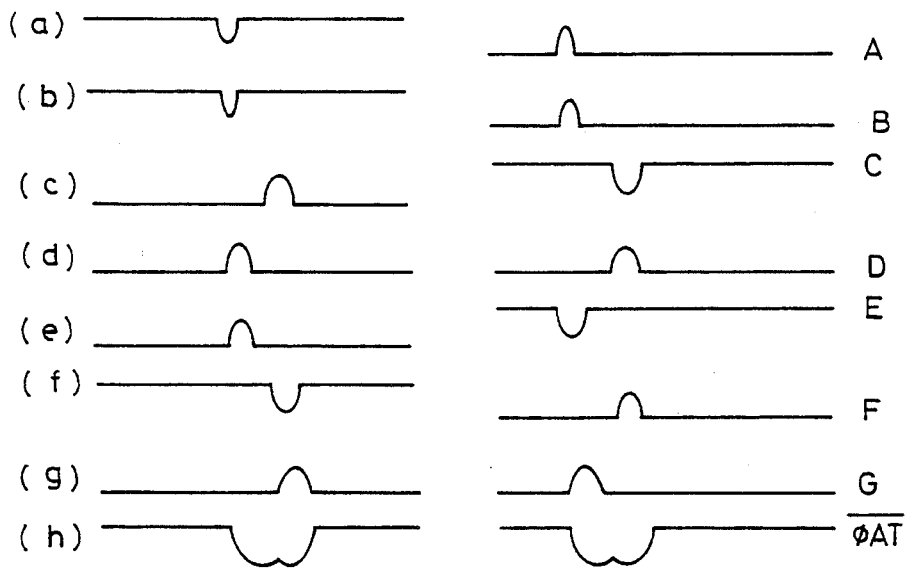
FIG. 3 is an illustration of the noise induced operation state waveforms of the circuit given in FIG. 1.

Therefore, when in noise induced operation state, first delay/inversion unit 12 and control inverter I19 are activated by inputs B given in (b) of FIG. 6. As a result, outputs E of second NOR gate NOR12 have the same width as the noises as shown in (e) of FIG. 6. However, their phases are reversed when compared to that of the noises. Outputs I of the third NOR gate NOR13 generated by the second delay inversion unit 13 and the control inverter I20 are affected by noises as in (g) of FIG. 3. However, by using outputs C of the first delay inversion unit 12 that remain in high state as in (c) of FIG. 6 until T2 time as inputs, outputs of the third NOR gate NOR13 are maintained in low state by the control inverter I19 that outputs signals given in (d) of FIG. 6 or odd-numbered inverter chains. Accordingly, ATD pulse signals $\overline{\phi AT}$ will have the same width as the noise input.

As explained in detail so far, the present invention uses ATD pulse width to determine whether it is an ATD operation caused by the normal address transition or an unnecessary ATD operation caused by the noise. This is made possible by distinguishing between two operations; in a normal operation state, a certain ATD pulse is gained, and in a noise induced operation state, the noise pulse width received is unchanged. Accordingly, the operation of the internal circuit related to these can be controlled so that the malfunctions due to the noise can be prevented.

This invention is in no way limited to the example described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. An address transition detection circuit, comprising:
    an input control unit comprising a first NOR gate and a first inverter, said first NOR gate having a first input electrically connected to an address input signal source and a second input electrically connected to a chip select signal source, said first NOR gate having an output electrically connected to an input of said first inverter wherein receipt of said address input and chip select signals by said first NOR gate causes a signal to be sent from said output of said first NOR gate to said input of said first inverter for inversion therein;
    a first delay/inversion unit electrically connected to an output of said first inverter for receiving said inverted signal from said first inverter, said first delay/inversion unit delaying and inverting said signal from said first inverter;
    a first control unit electrically connected to an output of said first delay/inversion unit for receiving said delayed and inverted signal from said first delay/inversion unit, said first control unit inverting said signal from said first delay/inversion unit;
    an intermediate inverter electrically connected to said output of said first inverter for receiving said signal from said first inverter, said intermediate inverter inverting said signal from said first inverter;
    a second delay/inversion unit electrically connected to an output of said intermediate inverter for receiving said inverted signal from said intermediate inverter, said second delay/inversion unit delaying and inverting said signal from said intermediate inverter;
    a second control unit electrically connected to an output of said second delay/inversion unit for receiving said delayed and inverted signal from said second delay/inversion unit, said second control unit inverting said signal from said second delay/inversion unit; and a logic combination unit electrically connected to outputs of said first and second control units, in a cross coupled arrangement, said logic combination unit be further connected to said first and second delay/inversion units, said input control unit and said intermediate inverter wherein said signals from said input control unit and first delay/inversion unit are combined with a signal from said second control unit, and wherein signals from said intermediate inverter and second delay/inversion unit are combined with a signal from said first control unit to produce an ATD pulse signal.

2. The circuit according to claim 1, wherein said first delay/inversion unit comprises second, third and fourth inverters which are serially connected, wherein said signal from said first inverter is received by said second inverter and inverted therein, said signal from said second inverter is received by said third inverter and inverted therein, and said signal from said third inverter is received by said fourth inverter and inverted therein, said fourth inverter having an output constituting said output of said first delay/invention unit.

3. The circuit according to claim 1, wherein said second delay/inversion unit comprises second, third and fourth inverters which are serially connected, wherein said signal from said intermediate inverter is received by said second inverter and inverted therein, said signal from said second inverter is received by said third inverter and inverted therein, and said signal from said third inverter is received by said fourth inverter and inverted therein, said fourth inverter having an output constituting said output of said second delay/inversion unit.

4. The circuit according to claim 1, wherein said first control unit comprises a control inverter having an input for receiving said delayed and inverted signal from said first delay/inversion unit, said control inverter having an output constituting said output of said first control unit.

5. The circuit according to claim 1, wherein said second control unit comprises a control inverter having an input for receiving said delayed and inverted signal from said second delay/inversion unit, said control inverter having an output constituting said output of said second control unit.

6. The circuit according to claim 1, wherein said logic combination unit includes second, third and fourth NOR gates wherein said second NOR gate is electrically connected to said outputs of said input control unit, first delay/inversion unit and second control unit enabling said second NOR gate to receive said signals from said input control unit, first delay/inversion unit and second control unit, and wherein further said third NOR gate is electrically connected to said outputs of said intermediate inverter, second delay/inversion unit and first control unit enabling said third NOR gate to receive said signals from said intermediate inverter, second delay/inversion unit and first control unit, said connection of said second control unit to said second NOR gate and said connection of said first control unit to said third NOR gate defining said cross coupling arrangement, and wherein further said fourth NOR gate is electrically connected to outputs of said second and third NOR gates enabling said fourth NOR gate to receive signals from said second and third NOR gates, said fourth NOR gate having an output for emitting said ATD pulse signal.

* * * * *